US008857330B2

(12) United States Patent
Uchida et al.

(10) Patent No.: US 8,857,330 B2
(45) Date of Patent: Oct. 14, 2014

(54) SCREEN PRINTER AND SCREEN PRINTING METHOD

(75) Inventors: Hideki Uchida, Yamanashi (JP); Isao Horie, Yamanashi (JP); Takashi Yazawa, Yamanashi (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/995,229

(22) PCT Filed: Sep. 11, 2012

(86) PCT No.: PCT/JP2012/005765
§ 371 (c)(1),
(2), (4) Date: Jun. 18, 2013

(87) PCT Pub. No.: WO2013/069183
PCT Pub. Date: May 16, 2013

(65) Prior Publication Data
US 2013/0269552 A1 Oct. 17, 2013

(30) Foreign Application Priority Data
Nov. 9, 2011 (JP) ................................. 2011-245145

(51) Int. Cl.
*B41M 1/12* (2006.01)
*B41F 15/08* (2006.01)
*B41F 15/40* (2006.01)
*B41F 15/42* (2006.01)
*B41F 15/44* (2006.01)
*H05K 3/12* (2006.01)
*H05K 3/34* (2006.01)

(52) U.S. Cl.
CPC .............. *B41F 15/44* (2013.01); *H05K 3/3484* (2013.01); *B41F 15/42* (2013.01); *H05K 3/1233* (2013.01)
USPC ............ 101/129; 101/123; 118/406; 427/282

(58) Field of Classification Search
CPC .... H05K 3/3484; H05K 3/1233; B41F 15/42; B41F 15/44; B41F 15/08; B41F 15/40
USPC ................. 101/114, 123, 124, 126, 129, 366; 118/213, 301, 406, 667, 712; 427/282
See application file for complete search history.

(56) References Cited

U.S. PATENT DOCUMENTS 6,286,422 B1    9/2001   Lin et al.
2003/0230203 A1  12/2003  Abe et al.

FOREIGN PATENT DOCUMENTS

JP        04-284249 A        10/1992
JP        2002-172756    *   12/2000   .............. B41F 15/40

(Continued)

OTHER PUBLICATIONS

International Search Report for PCT/JP2012/005765 dated Oct. 16, 2012.

*Primary Examiner* — Leslie J Evanisko
*Assistant Examiner* — Marissa Ferguson Samreth
(74) *Attorney, Agent, or Firm* — Pearne & Gordon LLP

(57) ABSTRACT

A holding mechanism 40 is made up of a shaft support 44 that is provided while joined to a joint and that has a vertically-oriented pivot 44a, a shaft member 45 that horizontally extends from the shaft support 44 and that is turnable around the pivot 44a, and a fitting section 36 that is formed in a squeegee unit 16 and to which the shaft member 45 is removably fitted. Thereby, the entirety of the squeegee unit 16 becomes removably attachable by only moving the squeegee unit 16 in a horizontal direction.

5 Claims, 10 Drawing Sheets

(56) References Cited

FOREIGN PATENT DOCUMENTS

| JP | 2002-225222 | * | 2/2001 | ............. B41F 15/40 |
| JP | 2002-001905 A | | 1/2002 | |
| JP | 2003-505273 A | | 2/2003 | |
| JP | 2004-25694 A | | 1/2004 | |
| JP | 2004-130516 A | | 4/2004 | |

* cited by examiner (a)

(b)

(c)

(a)

(b)

SCREEN PRINTER AND SCREEN PRINTING METHOD

TECHNICAL FIELD

The invention relates to a screen printer and a screen printing method for printing a substrate with paste, like cream solder and conductive paste.

BACKGROUND ART

A method using a closed squeegee head has hitherto been known as a screen printing method of printing a substrate with paste, like cream solder and conductive paste, in an electronic component mounting step. Under the method, as opposed to normal screen printing in which paste is fed directly over a mask plate, paste in a squeegee head is pressurized while the squeegee head with internally stored paste is held in contact with a mask plate.

The paste is thereby squeezed into pattern holes of the mask plate by a paste contact surface provided on a lower surface of the squeegee head. The squeegee head is then slid over the mask plate, thereby sequentially filling the respective pattern holes with the paste (see; for instance, Patent Document 1). In the example described in connection with the patent document, the squeegee head is separated into an upper portion including a cartridge that stores the paste and a lower portion including a printing space where the pressurized paste is brought into contact with the mask plate. The upper portion is reclosable while axially fastened to the lower portion.

RELATED ART DOCUMENT

Patent Document

Patent Document 1: JP-A-2002-1905

DISCLOSURE OF THE INVENTION

Problem that the Invention is to Solve

The related art technique described in connection with the patent document, however, has a drawback, such as that described below. Specifically, in the related art technique, the squeegee head is separated into the upper portion and the lower portion. The cartridge is replaced by opening the upper portion. For this reason, a space where the upper portion is turned while the squeegee head remains attached to the printer is required, which results in an impediment to miniaturization of a configuration of the squeegee head in the printer. Cartridge replacement must be performed in a narrow space at paste replenishment work while the squeegee head is kept attached to the printer. Therefore, workability is poor, and time and efforts are consumed every time a cartridge is replaced.

Accordingly, the invention aims at providing a screen printer and a screen printing method that enable miniaturization of a configuration of the printer and easy performance of cartridge replacement work.

Means for Solving the Problem

A screen printer of the invention is directed toward a screen printer that prints a substrate with paste by pattern holes of a mask plate by sliding a squeegee head over the mask plate with a head drive mechanism, wherein the squeegee head has a joint joined to the head drive mechanism, a replaceable paste reservoir that stores paste, paste pressurizing unit that is placed on the joint and that pressurizes the paste in the paste reservoir, a print space that stores the pressurized paste and that brings the paste into contact with a surface of the mask plate, and two scraping members that form front and back walls of the print space in a squeegeeing direction and whose lower ends contact a surface of the mask plate; the paste reservoir, the print space, and the scraping members configure a squeegee unit that can be integrally attached to and detached from the joint; and a holding mechanism that positions and holds the squeegee unit with respect to the joint has a shaft support which is joined to the joint and which has a vertically-oriented pivot, a shaft member that horizontally extends from the shaft support and that is turnable around the pivot, and a fitting section that is formed in the squeegee unit and to which the shaft member is removably fitted.

A screen printing method of the invention is directed toward a screen printing method for printing a substrate with paste through pattern holes of a mask plate by sliding a squeegee head over the mask plate by a head drive mechanism, wherein the squeegee head has a joint joined to the head drive mechanism, a replaceable paste reservoir that stores paste, paste pressurizing unit that is placed on the joint and that pressurizes the paste in the paste reservoir, a print space that stores the pressurized paste and that brings the paste into contact with a surface of the mask plate, and two scraping members that form front and back walls of the print space in a squeegeeing direction and whose lower ends contact a surface of the mask plate; the paste reservoir, the print space, and the scraping members configure a squeegee unit that can be integrally attached to and detached from the joint; a holding mechanism that positions and holds the squeegee unit with respect to the joint has a shaft support which is joined to the joint and which has a vertically-oriented pivot, a shaft member that horizontally extends from the shaft support and that is turnable around the pivot, and a fitting section that is formed in the squeegee unit and to which the shaft member is removably fitted: when the paste in the paste reservoir has run out in processes of pressurizing the paste in the paste reservoir in the squeegee head, to thus house the paste in the print space located below and bring the paste into contact with the surface of the mask plate, thereby printing the paste, the squeegee unit is rotated with respect to the joint by turning the shaft member around the shaft support, and the fitting section is detached from the shaft member, thereby separating the squeegee unit from the joint and replacing the paste reservoir.

Advantage of the Invention

According to the invention, the squeegee unit is made up of the paste reservoir, the print space, and the scraping members and removably attached to or detached from the joint in an integrated fashion. The holding mechanism that positions and holds the squeegee unit with respect to the joint is made up of: the shaft support that is joined to the joint and that has the vertically-oriented pivot; the shaft member that horizontally extends from the shaft support and that is turnable around the pivot; and the fitting section that is formed in the squeegee unit and to which the shaft member is removably fitted. As a result, the entirety of the squeegee unit can be made removably attachable by only moving the squeegee unit in the horizontal direction. Miniaturization of the screen printer and facilitation of cartridge replacement work can be implemented.

EMBODIMENT FOR IMPLEMENTING THE INVENTION

Figure 1:
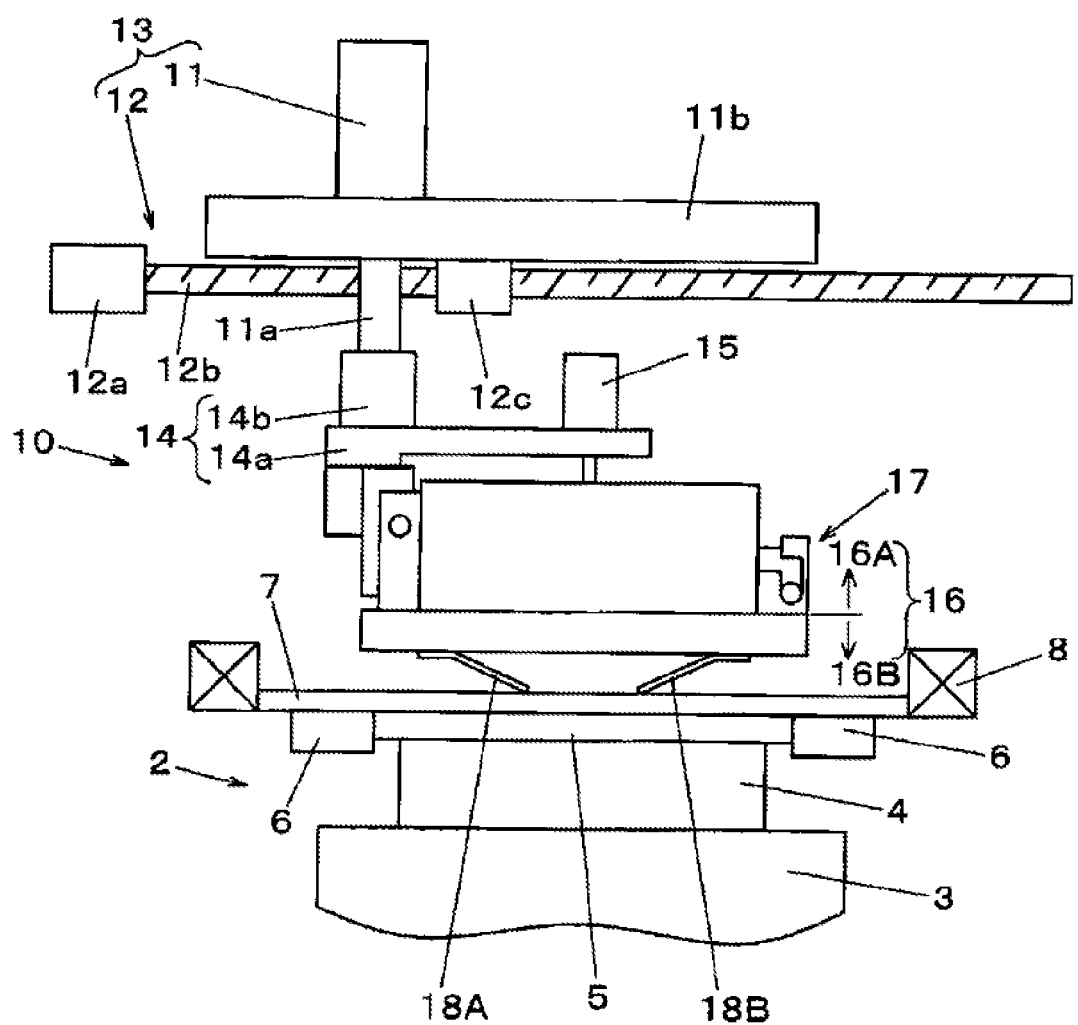
FIG. 1 is a front view of a screen printer of an embodiment of the invention.
Figure 2:
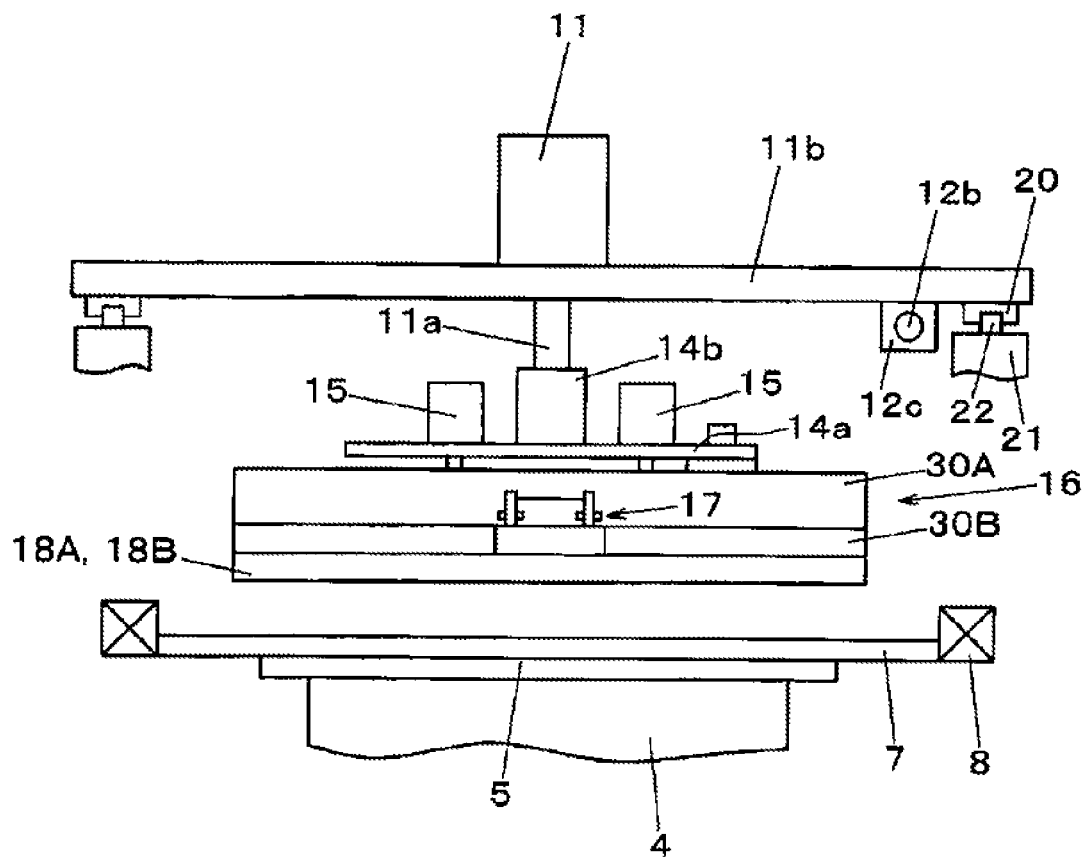
FIG. 2 is a side view of the screen printer of the embodiment of the invention.

An embodiment of the invention is now described by reference to the drawings. An entire configuration of a screen printer 1 is first described by reference to FIGS. 1, 2, and 3. The screen printer 1 exhibits the following function. Namely, a squeegee head 10 is slid over a mask plate 7 by a head drive mechanism 13, thereby printing a substrate 5 with cream solder 9, which is electronic component bonding paste, by pattern holes 7a of the mask plate 7. In FIGS. 1 and 2, the screen printer 1 is configured such that the mask plate 7 held by a mask holder 8 is disposed at an elevated position above a substrate positioning section 2 and that a screen printing mechanism is also placed above the mask plate 7.

A configuration of the substrate positioning section 2 is described. A substrate underpart receiver 4 is disposed on an upper surface of a moving table 3 so as to be capable of ascending and descending actions. The substrate 5 which is a target of printing is held from its underside by elevation of the substrate underpart receiver 4. In addition, the substrate 5 is sandwiched and fixed sidewise between a pair of clamp members 6. By actuation of the moving table 3, the substrate 5 is positioned in a horizontal direction with respect to the mask plate 7, coming into contact with an underside of the mask plate 7 fixed by the mask holder 8.

A configuration of the screen printing mechanism is now described.

The squeegee head 10 placed above the mask plate 7 is actuated by the head drive mechanism 13 made up of a head elevation mechanism 11 and a head moving mechanism 12. The head elevation mechanism 11 is placed on a horizontal moving plate 11b, and a joint block 14b of a joint 14 that makes up the squeegee head 10 is joined to an elevation shaft 11a that extends downwards from the head elevation mechanism 11. The squeegee head 10 moves up and down with respect to the mask plate 7 by actuation of the head elevation mechanism 11, whereupon scraping members 18A and 18B attached to an underside of the squeegee head 10 come into contact with an upper surface of the mask plate 7.

A configuration of the head moving mechanism 12 is described. A nut 12c is joined to the underside of the moving plate fib. A feed screw 12b screw-engaged with the nut 12c is rotationally driven by a motor 12a. As shown in FIG. 2, a slider 20 is fixed to either end on the underside of the moving plate 11b, and the sliders 20 are slidably fit on guide rails 22 laid on upper surfaces of respective frames 21. The moving plate 11b is horizontally moved by driving the motor 12a, whereupon the squeegee head 10 joined to the elevation shaft ha also moves in a horizontal direction. The motor 12a is driven while the squeegee head 10 is held lowered, the squeegee head 10 horizontally moves over the mask plate 7. Specifically, the motor 12a, the feed screw 12b, and the nut 12c configure the head moving mechanism 12 that horizontally moves the squeegee head 10 over the mask plate 7.

Figure 3:
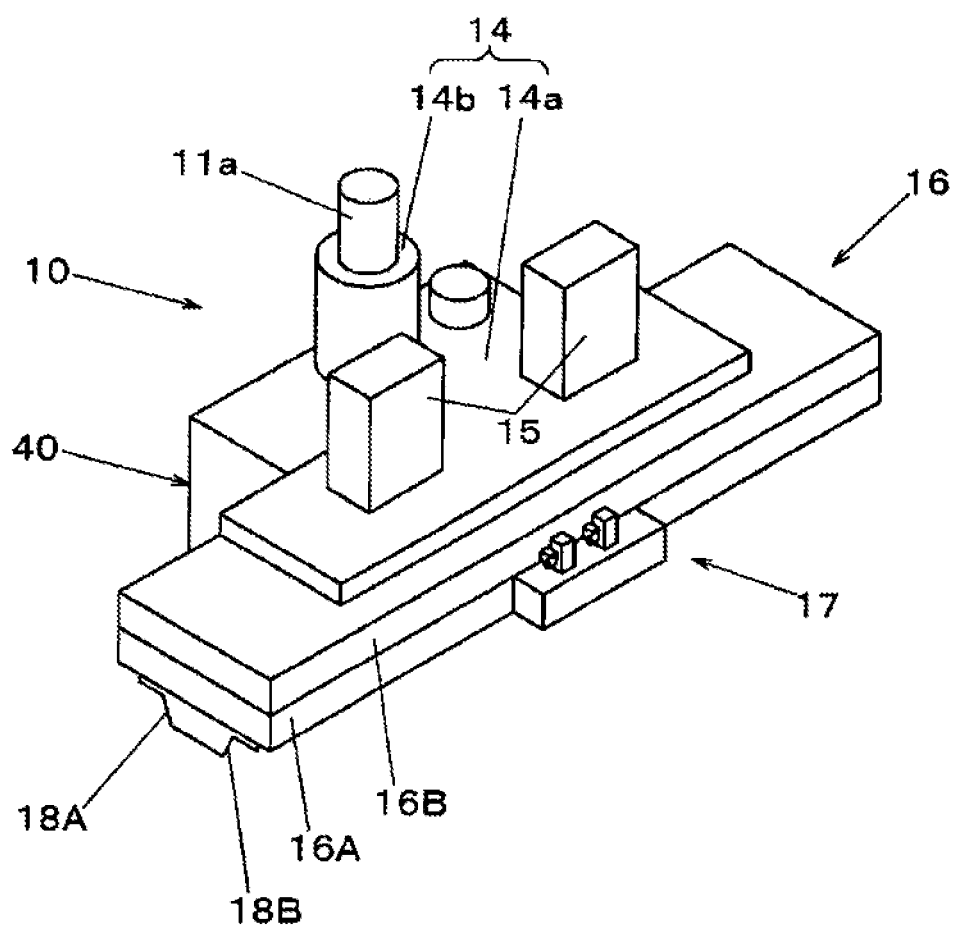
FIG. 3 is a perspective view of a squeegee head of the screen printer of the embodiment of the invention.
Figure 4:
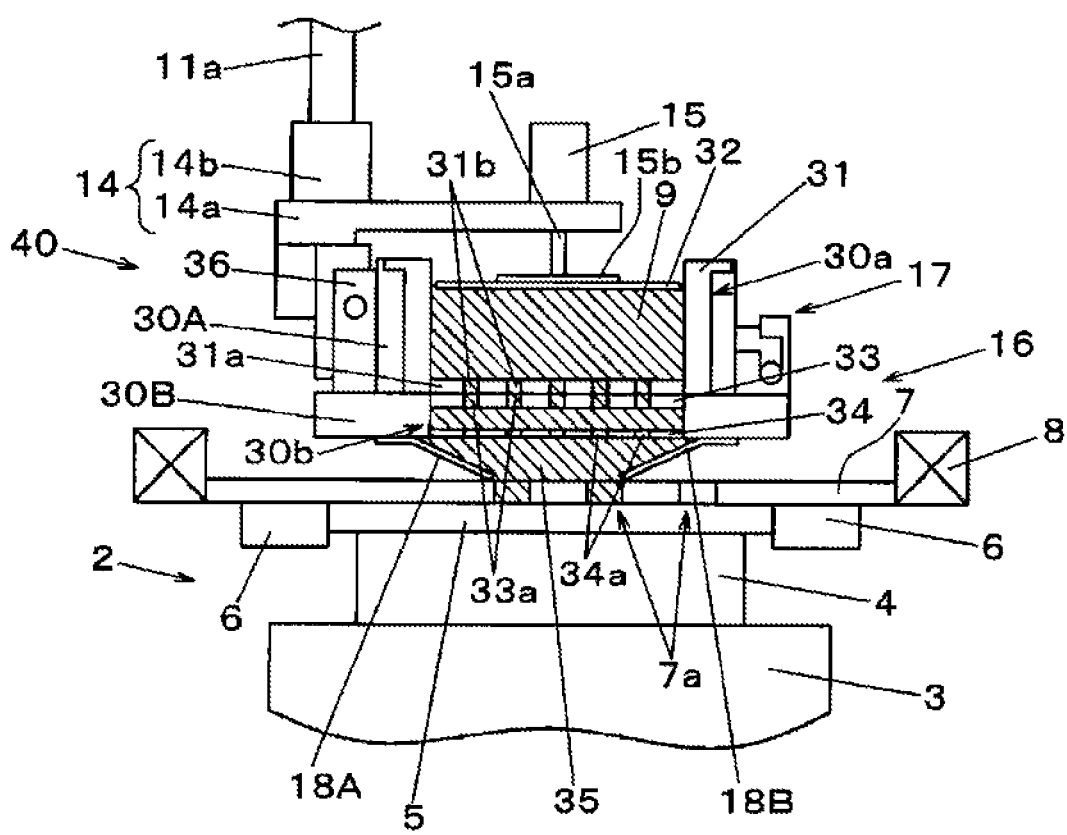
FIG. 4 is a fragmentary sectional view of the squeegee head of the screen printer of the embodiment of the invention.

A configuration of the squeegee head 10 is now described. As shown in FIGS. 3 and 4, the squeegee head 10 is equipped with a squeegee unit 16 that fills the pattern holes 7a with cream solder 9, which is paste, on contact with a surface of the mask plate 7. The squeegee unit 16 is split into an upper portion 16A and a lower portion 16B. In the embodiment, the squeegee unit 16 into which the upper portion 16A and the lower portion 16B are integrated is joined to the moving plate 11b of the head drive mechanism 13 with the joint 14. The squeegee unit 16 is positioned and held with respect to the joint 14 by a holding mechanism 40, which will be described later.

As shown in FIG. 3, the upper portion 16A and the lower portion 16B are equipped with an body upper portion 30A and a body lower portion 30B that are block-shaped members and elongated in a widthwise direction of the mask plate 7. As shown in FIG. 2, the length of the body upper portion 30A and the length of the body lower portion 30B are set so as to cover a width of the substrate 5 that is a target of printing. The body upper portion 30A and the body lower portion 30B are reclosably joined together with a hinge 17.

An indentation 30a to which a cartridge 31 storing the cream solder 9 is removably attached is formed in the body upper portion 30A. The cartridge 31 serves as a paste reservoir where a predetermined amount of the cream solder 9 is stored and is attached to the body upper portion 30A during printing. A pressurizing plate 32 that pressurizes the cream solder 9 stored in the cartridge is fitted into an opening formed in an upper surface of the cartridge 31. A depressing member 15b joined to a rod 15a of a cylinder 15 mounted on a joint plate 14a remains in contact with an upper surface of the pressurizing plate 32. The pressurizing plate 32 can be pressed down within the cartridge 31 by actuation of the cylinder 15.

A bottom side of the cartridge 31 serves as a cream solder extruding plate 31a, and a plurality of openings 31b are formed in the extruding plate 31a. The pressurizing plate 32 is pressurized downward with the cylinder 15, whereupon the cream solder 9 in the cartridge 31 is pressurized and extruded downward by the openings 31b of the extruding plate 31a. The cylinder 15 serves as paste pressurizing unit that is placed on the joint plate 14a to pressurize the cream solder 9, which is paste, within the cartridge 31.

An overall opening 30b that is in mutual communication with an interior of the cartridge 31 is provided in the body lower portion 30B. An adhesion inhibition plate 33 is disposed on the overall opening 30b while remaining in contact with the extruding plate 31a on the bottom of the cartridge 31. Circular openings 33a are formed, while aligned to the corresponding openings 31b of the extruding plate 31a, in the adhesion inhibition plate 33 (see also FIG. 7). The adhesion inhibition plate 33 inhibits the cream solder 9, which is extruded downward from the cartridge 31, from adhering to the bottom of the cartridge 31; namely, an area of the underside of the extruding plate 31a other than the openings 31b.

A squeezing plate 34 with a plurality of openings 34a in the same way as does the extruding plate 31a of the cartridge 31 is provided on the bottom of the overall opening 30b of the body lower portion 30B. When extruded under pressure of the cylinder 15, the cream solder 9 passes downwards through three stages; namely, the openings 31b of the extruding plate 31a, the openings 33a of the adhesion inhibition plate 33, and the openings 34a of the squeezing plate 34. The thus-extruded cream solder 9 arrives at a space formed beneath the body lower portion 30B; namely, a print space 35 enclosed by the underside of the body lower portion 30B and the two scraping members 18A, 18B placed on an underside of the body lower portion 30B at inward inclines.

The scraping members 18A, 18B form front and back walls of the print space 35 in a squeezing direction. In a state where the squeegee head 10 is lowered, lower ends of the respective scraping members 18A and 18B contact the surface of the mask plate 7. During printing operation, the print space 35 stores the pressurized cream solder 9 and brings the cream solder 9 into contact with the surface of the mask plate 7 by a print plane existing between the scraping members 18A and 18B.

The cream solder 9 in the cartridge 31 is pressurized by lowering the pressurizing plate 32, thereby migrating to an interior of the print space 35 while passing through the extruding plate 31a, the adhesion inhibition plate 33, and the squeezing plate 34. A sectional area of a migration pathway of the cream solder 9 is narrowed in midstream by the plurality of small openings 31b, 33a, and 34a. As a result of the pressurized cream solder 9 passing through the openings, a viscosity of the cream solder 9 decreases, whereby the cream solder 9 is reformed to a property suitable for screen printing.

Specifically, the squeegee head 10 described in connection with the embodiment includes the joint 14 joined to the head drive mechanism 13, the cartridge 31 that serves as the replaceable paste reservoir for storing the cream solder 9; the head elevation mechanism 11 that is placed on the joint 14 and that pressurizes the cream solder 9 in the cartridge 31; the print space 35 that stores the thus-pressurized cream solder 9 and that brings the cream solder 9 into contact with the surface of the mask plate 7; and the two scraping members 18A, 18B that configure front and back walls of the print space 35 in the squeezing direction and whose lower ends contact the surface of the mask plate 7. The squeegee unit 16 that can be integrally attached to and detached from the joint 14 is made up of the upper portion 16A that houses the cartridge 31 and the lower portion 16B that has the print space 35 and the scraping members 18A and 18B.

Figure 5:
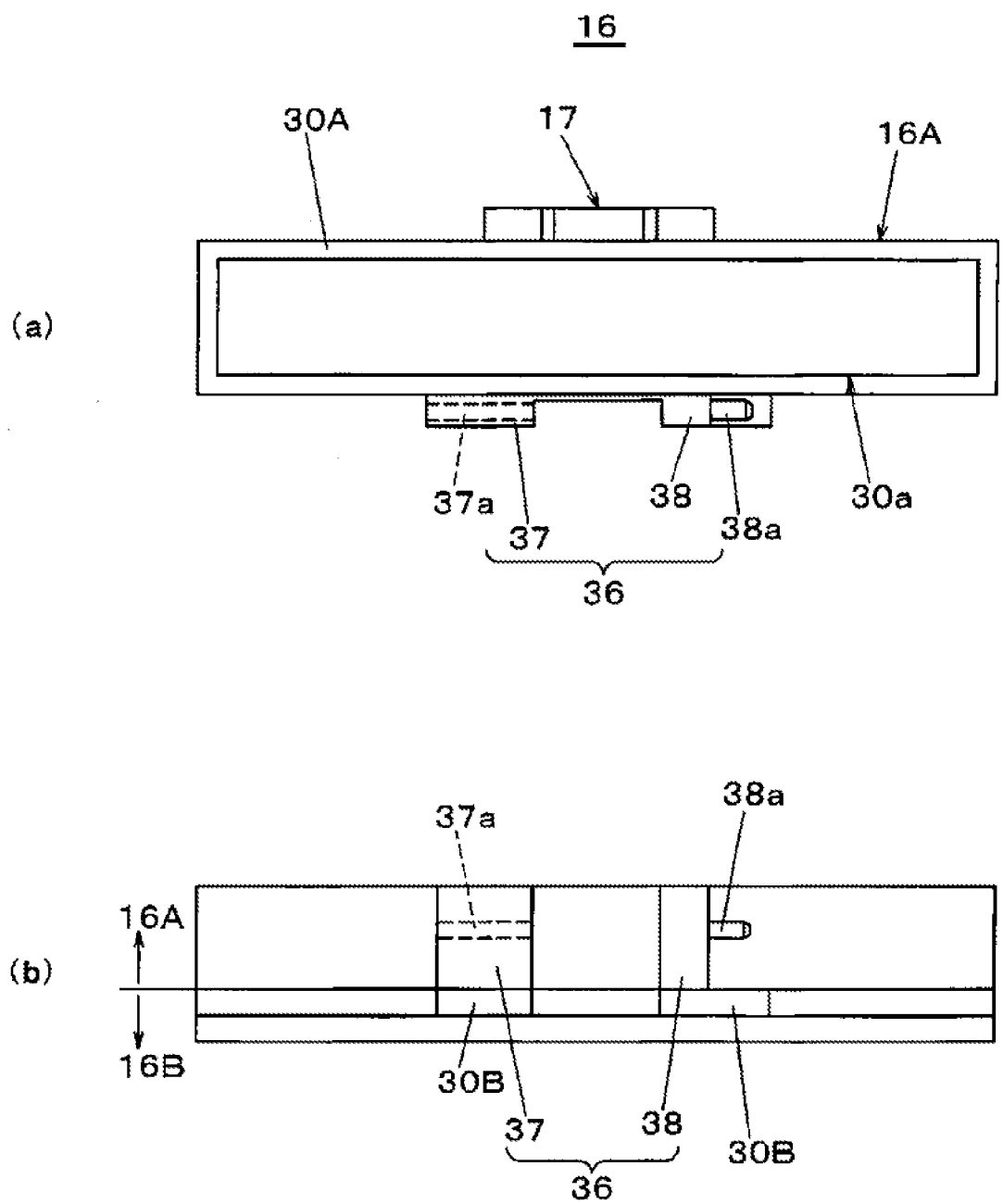
FIG. 5 is descriptive views in which (a) and (b) show configuration of a squeegee unit of the screen printer of the embodiment of the invention.
Figure 6:
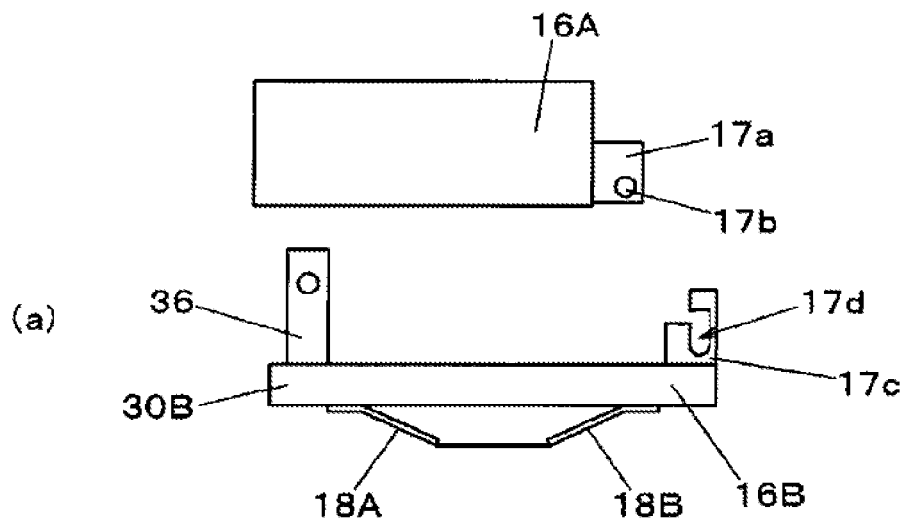
FIG. 6 is a descriptive view in which (a), (b), and (c) show configuration of the squeegee unit and an open-close mechanism of the screen printer of the embodiment of the invention.
Figure 6:
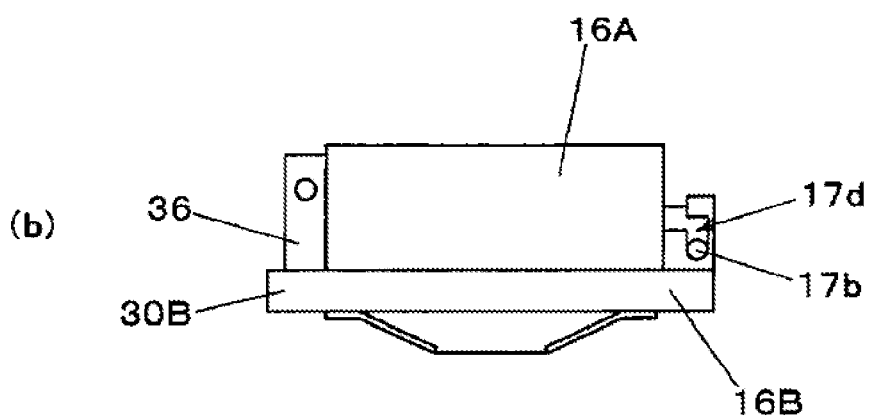
Figure 6:
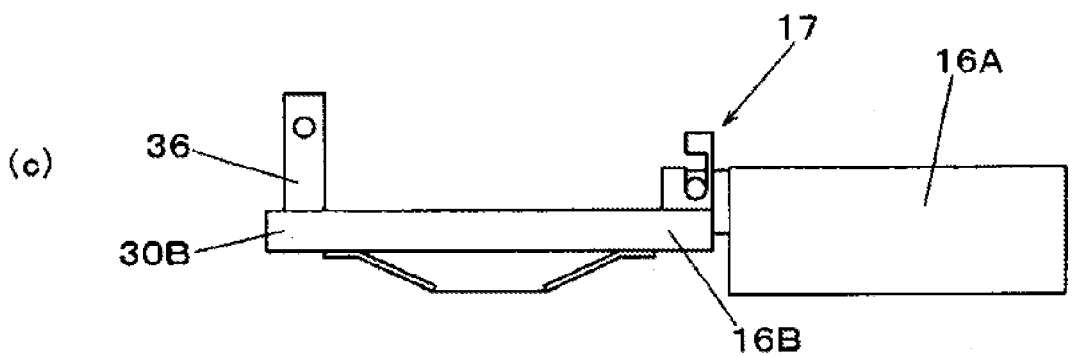
Figure 7:
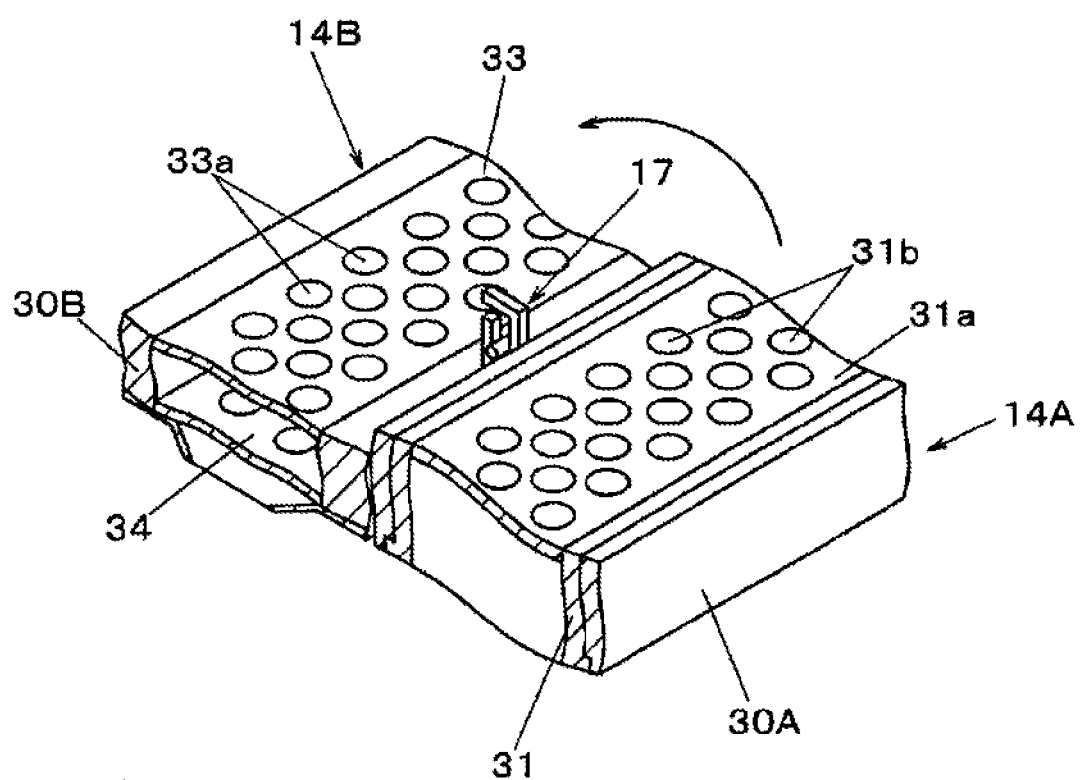
FIG. 7 is a descriptive view showing an open-close state of the squeegee unit of the screen printer of the embodiment of the invention.

By reference to (a) and (b) in FIG. 5, (a), (b), and c in FIG. 6, and FIG. 7, the configuration of the squeegee unit 16 and coupling/decoupling and opening-closing operation of the upper portion 16A and the lower portion 16B that configure the squeegee unit 16 are now described. As shown (a) in FIG. 5, the hinge 17 for hinging together the upper portion 16A and the lower portion 16B is provided on one side surface of the squeegee unit 16.

Provided on the other side surface of the squeegee unit 16 is a fitting section 36 that makes up the holding mechanism 40 for integrally holding the squeegee unit 16 on the joint 14. The fitting section 36 is provided on partial, lateral protuberances from the body lower portion 30B of the lower portion 16B. The fitting section 36 is made up of a hole 37 having a fitting slot 37a intended for fit insertion of a shaft member 45 (FIG. 8) and a positioning section 38 on which a positioning pin 38a to fit into a positioning hole 41a (FIG. 8) is projectingly provided.

As mentioned above, the squeegee unit 16 is split into the upper portion 16A including the cartridge 31 and the lower portion 16B including the print space 35. The upper portion 16A and the lower portion 16B are separably, reclosably hinged together by the hinge 17. As shown in (a) in FIG. 6, a hinge plate 17a with a pin 17b is fixed to a side surface of the upper portion 16A, and a hinge plate 17c with a pin groove 17d is fixed to a side surface of the lower portion 16B. The hinge plate 17c is partially cut out, and an upper portion of the pin groove 17d is partially opened. When the upper portion 16A is attached onto the lower portion 16B, the pin 17b is fitted, as shown in (b) in FIG. 6, into the pin groove 17d by the cutout of the hinge plate 17c. The upper portion 16A is thereby attached to a correct position on an upper surface of the lower portion 16B.

The upper portion 16A in this state is turned around the pin 17b as a fulcrum, whereupon the upper portion 16A is inverted and detached from the lower portion 16B as shown in (c) in FIG. 6. Specifically, the upper portion 16A is reclosable while the upper portion 16A is axially supported by the lower portion 16B. As shown in FIG. 7, the upper portion 16A is held with the extruding plate 31 a on the bottom side of the upper portion oriented upward, to thus assume a position at which the cartridge 31 in the indentation 30a becomes removable.

Figure 8:
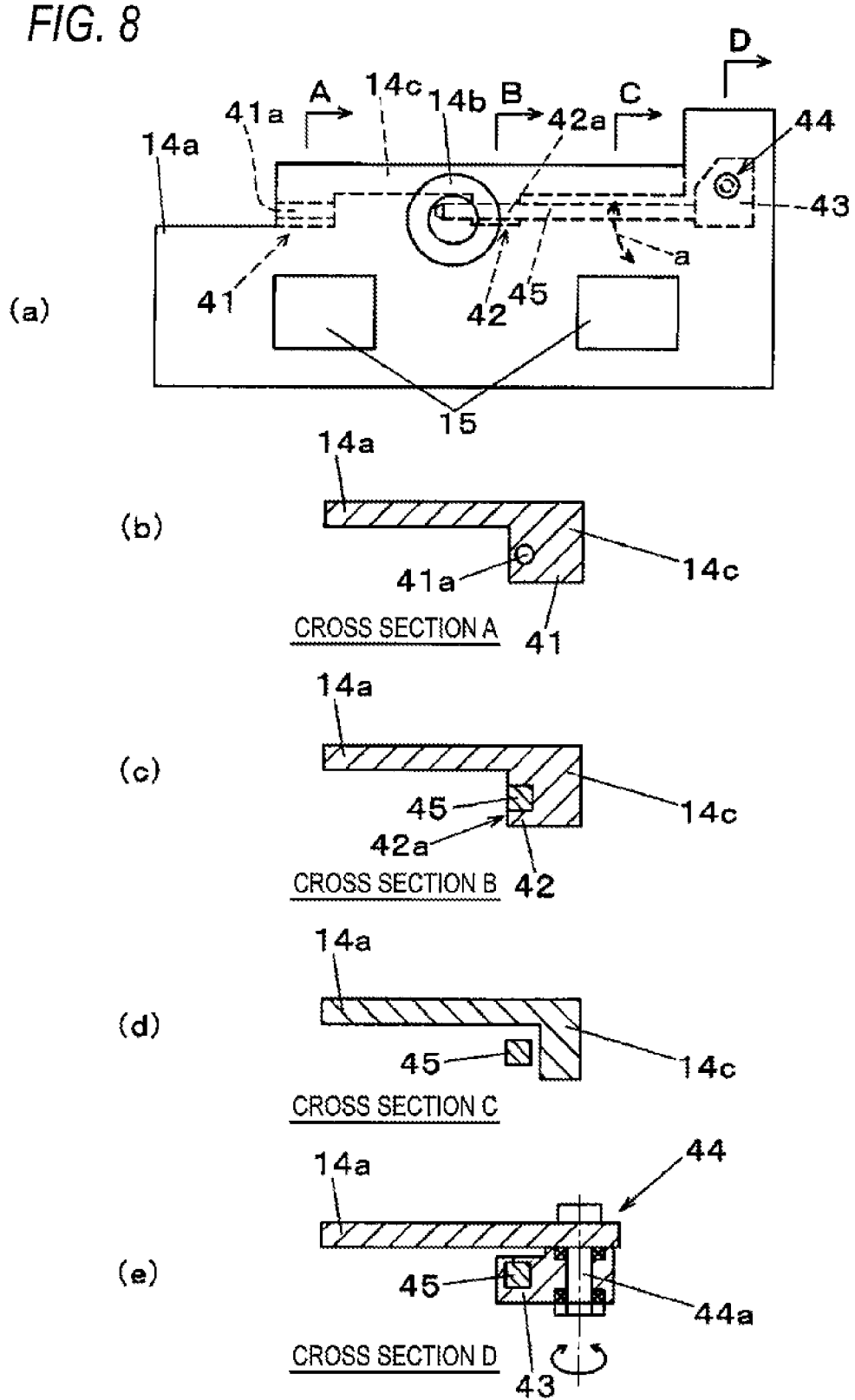
FIG. 8 is a descriptive view in which (a) to (e) show configuration of a joint in the squeegee head of the screen printer of the embodiment of the invention.
Figure 9:
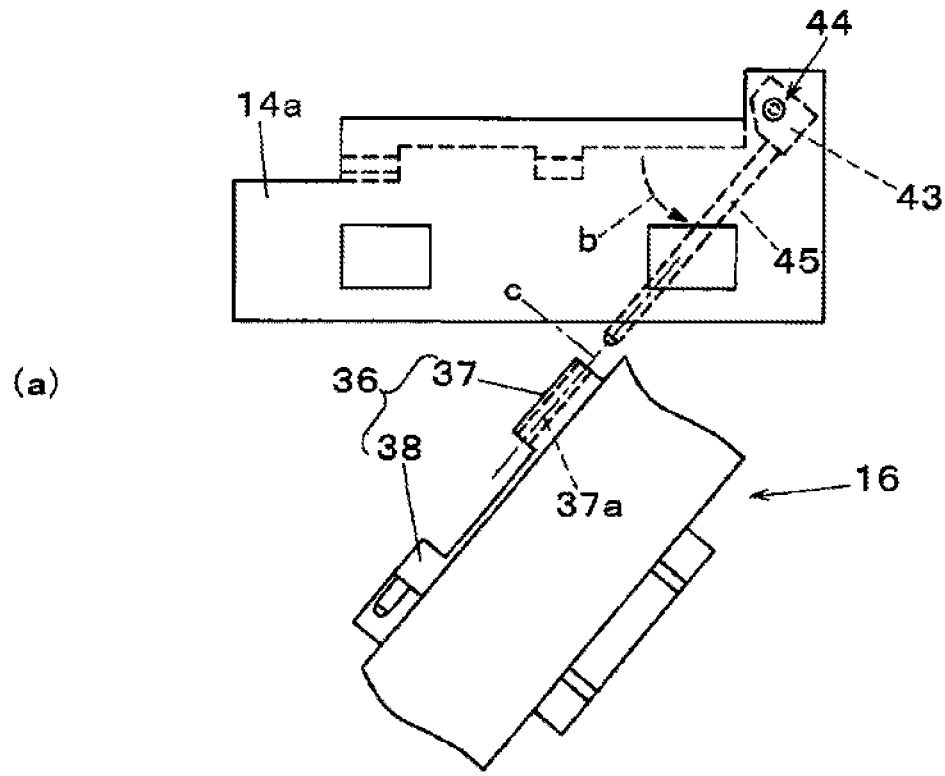
FIG. 9 is a descriptive view in which (a) and (b) show operation pertaining to a method for removal attachment of the squeegee unit in the screen printer of the embodiment of the invention.
Figure 9:
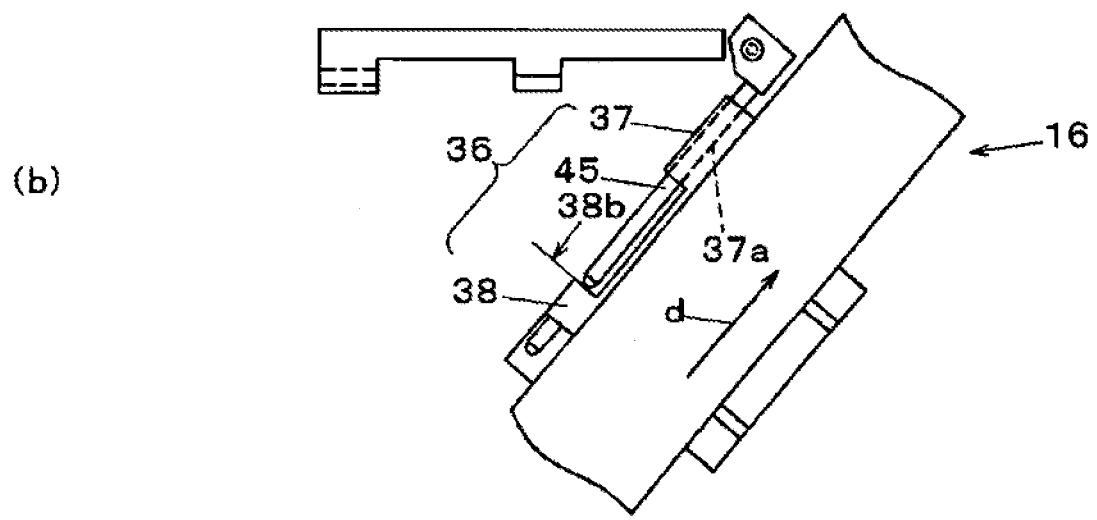
Figure 10:
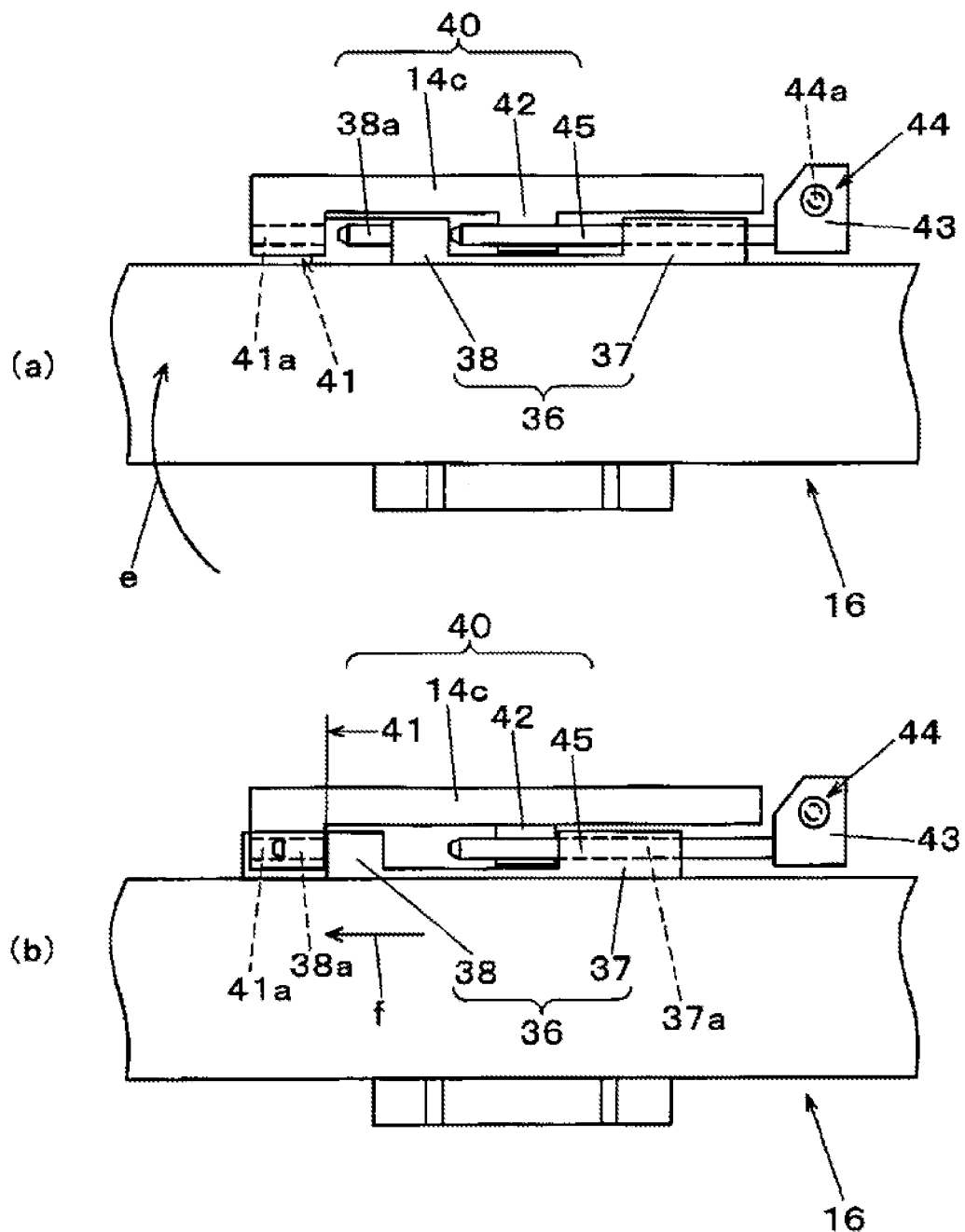
FIG. 10 is a descriptive view in which (a) and (b) shows operation pertaining to a method for removal attachment of the squeegee unit in the screen printer of the embodiment of the invention.

By reference to (a) to (e) in FIG. 8, (a) and (b) in FIG. 9, and (a) and (b) in FIG. 10, the holding mechanism 40 for integrally attaching or detaching the squeegee unit 16 to or from the joint 14 is now described. First, by reference to (a) to (e) in FIG. 8, a shape of the joint 14 is described. In FIG. 8, (a) shows a shape of the joint 14 shown in FIG. 3 when viewed in plane, and in FIG. 8, (b), (c), (d) and (e) show a cross section A, a cross section B, a cross section C, and a cross section D in (a) in FIG. 8. The joint plate 14a is a plate member that comes to a position facing an upper surface side of the squeegee unit 16 when the squeegee unit 16 remains joined to the joint 14. A downwardly-extended protuberance 14c is provided along an edge on one side of the plate member. A shaft holding member 43 that is axially supported by a shaft support 44 having a vertically-oriented pivot 44a is disposed in an extension of the longitudinal direction of the protuberance 14c of the joint plate 14a, so as to be turnable around the pivot 44a. The shaft member 45 having a rectangular cross section horizontally protrudes from the shaft holding member 43 in a direction parallel to the protuberance 14c.

As shown in (b) in FIG. 8, an inwardly-protruding protrusion 41 is provided on the protuberance 14c when viewed in the cross section A. The positioning hole 41a into which the positioning pin 38a (see (a) and (b) in FIG. 5) is to be fitted is opened in the protrusion 41. As shown in (c) in FIG. 8, another inwardly-protruding protrusion 42 is provided in the protuberance 14c when viewed in the cross section B. A fitting groove 42a having a rectangular cross section into which the shaft member 45 is to be fitted is formed in the protrusion 42.

Further, when viewed in the cross section C shown in (d) in FIG. 8, the protrusion is not provided in the protuberance 14c, and the shaft member 45 is situated along a direction parallel to the protuberance 14c. Further, as shown in (e) in FIG. 8, the pivot 44a is fixed in the vertical direction on the joint plate 14a when viewed in the cross section ID, and the shaft, holding member 43 having a built-in shaft bearing is rotatably attached to the pivot 44a. The shaft member 45 having a rectangular cross section horizontally extends out of the shaft holding member 43, and the shaft member 45 is turnable around the pivot 44a (see arrow "a" shown in (a) in FIG. 8).

When the joint 14 is caused to hold the squeegee unit 16, the shaft member 45 is first turned (as designated by arrow "b") around the shaft support 44 as shown in (a) in FIG. 9, thereby positioning the squeegee unit 16 such that the center line of the fitting slot 37a opened in the hole 37 of the squeegee unit 16 comes into alignment with an extension "c" of the shaft member 45. Next, as shown in (b) in FIG. 9, the squeegee unit 16 is moved along the axial direction of the shaft member 45 (as designated by arrow "d"), thereby fitting the shaft member 45 into the fitting slot 37a. Further, the shaft member 45 is pushed to a position where an extremity of the shaft member 45 contacts an end face 38b of the positioning section 38.

Subsequently, as shown in (a) in FIG. 10, the squeegee unit 16 is turned around the shaft support 44 (as designated by arrow "e") to a position where the shaft member 45 comes into alignment with the protuberance 14c. The shaft member 45 is fitted into and pressed against the fitting groove 42a of the protrusion 42. The axis of the positioning pin 38a comes into agreement with the positioning hole 41a of the protrusion 41. Next, as shown in (b) in FIG. 10, the squeegee unit 16 is shifted in a direction (designated by arrow "f") in which the positioning pin 38a fits into the positioning hole 41a, where an end of the positioning section 38 contacts the protrusion 41. The shaft member 45 thereby fits into the fitting slot 37a and further into the fitting groove 42a. As a result of the positioning pin 38a fitting into the positioning hole 41a, the squeegee unit 16 is positioned and held at a correct location by the joint 14.

Specifically, the holding mechanism 40 that holds the squeegee unit 16 in alignment with the joint 14 is made up of the shaft support 44 that is coupled to the joint 14 and that has the vertically-oriented pivot 44a, the shaft member 45 that horizontally extends from the shaft support 44 and that is turnable around the pivot 44a, and the fitting section 36 that is formed in the squeegee unit 16 and that has the fitting slot 37a into which the shaft member 45 is removably fitted.

A cross sectional profile of the fitting slot 37a is defined in imitation of the rectangular cross section of the shaft member 45 and yields a turn inhibition effect. For this reason, inconvenience, which would otherwise be caused by turning of the squeegee unit 16 around the shaft member 45, is prevented. Specifically, in the holding mechanism 40, the fitting slot 37a and the shaft member 45 configure a turn inhibition mechanism that inhibits occurrence of relative turning between the fitting section 36 and the shaft member 45 while the shaft member 45 remains fitted to the fitting section 36.

Furthermore, the positioning pin 38a of the fitting section 36 is fitted into the positioning hole 41a, and the positioning section 38 contacts the protrusion 41. Moreover, the shaft member 45 is fitted into the fitting groove 42a, thereby preventing occurrence of axial and radial positional misalignment among the fitting section 36, the positioning pin 38a, and the shaft member 45. Specifically, in the holding mechanism 40, a combination of the fitting section 36 with the positioning pin 38a and a combination of the shaft member 45 with the fitting groove 42a configure a misalignment prevention mechanism that regulates relative, axial, radial displacement between the fitting section 36 and the shaft member 45 while the shaft member 45 remains fitted to the fitting section 36.

In the configuration mentioned as the example of the joint 14 in the embodiment, the joint block 14b is provided on the joint plate 14a, and the holding mechanism 40 that positions and holds the squeegee unit 16 is additionally built into the protuberance 14c downwardly extended from one edge of the joint plate 14a. However, another example of the mechanism can also be adopted, so long as the holding mechanism 40 that is joined to the head drive mechanism 13 and that positions and holds the squeegee unit 16 can be built into the mechanism.

The squeegee unit 16 equipped with the cartridge 31 is thus held by the joint 14, whereby the squeegee unit becomes able to perform screen printing. During screen printing, the cream solder 9 in the cartridge is pressurized by the pressurizing plate 32, whereupon the print space 35 of the squeegee unit 16 is filled with the cream solder 9 that has been reformed to assume appropriate viscosity as mentioned above. The squeegee unit 16 is slid over the mask plate 7. The pattern holes 7a of the mask plate 7 are thereby filled with the paste in the print space 35 by the print plane located between the scraping members 18A, 18B.

The pattern holes 7a are sequentially filled with the cream solder 9 by further moving the squeegee unit 16. After all of the pattern holes 7a are filled with the cream solder, the substrate positioning section 2 is lowered, thereby releasing the mask plate. Specifically, the cream solder 9 caught in the pattern holes 7a descends with the substrate 5, to thus leave the pattern holes 7a. Screen-printing the substrate 5 with the cream solder 9 is thereby completed.

The cream solder 9 of the cartridge 31 is pressurized in the squeegee head 10, thereby letting the print space 35 located downward accommodate the cream solder 9. The cream solder 9 is brought into contact with the surface of the mask plate 7, thereby printing the substrate with the cream solder 9. When the cream solder 9 of the cartridge 31 has run out in the middle of foregoing operation, work of replacing the cartridge 31 is performed. During the work of replacing the cartridge 31, working operation shown in (a) and (b) in FIG. 9 and (a) and (b) in FIG. 10 are performed in reverse order.

The shaft member 45 fitted to the fitting slot 37a of the squeegee unit 16 is turned around the shaft support 44, thereby turning the squeegee unit 16 within a horizontal plane with respect to the joint 14. Next, the squeegee unit 16 is moved in the squeegeeing direction, thereby detaching the fitting section 36 from the shaft member 45. The squeegee unit 16 is thereby detached from the joint 14. While the squeegee unit 16 stays at a position where superior workability is attained, the upper portion 16A and the lower portion 16B of the squeegee unit 16 are opened, and the cartridge 31 is replaced.

As mentioned above, in relation to the screen printing of the invention, the holding mechanism 40 is made up of the cartridge 31, the print space 35, and the scraping members 18A, 18B and positions and holds the squeegee unit 16, which can be integrally attached to and detached from the joint 14, with respect to the joint 14. The holding mechanism 40 is built from the shaft support 44 that is coupled to the joint 14 and that has the vertically-oriented pivot 44a, the shaft member 45 that horizontally extends from the shaft support 44 and is turnable around the pivot 44a, and the fitting section 36 that is formed in the squeegee unit 16 and to which the shaft member 45 is removably fitted. The entirety of the squeegee unit 16 can be removably attached by only moving the squeegee unit 16 in the horizontal direction. Thus, the configuration of the screen printer is miniaturized, and cartridge replacement work can be easily performed.

The embodiment provides an example intended for the configuration where the squeegee unit 16 can be split into the upper portion 16A and the lower portion 16B. However, the invention is not always limited to the embodiment. Even the configuration in which portions equivalent to the upper portion 16A and the lower portion 16B are fixedly integrated into a single piece is an object of application of the invention.

The patent application is based on Japanese Patent Application (JP-2011-245145) filed on Nov. 9, 2011, the subject matter of which is incorporated herein by reference in its entirety.

INDUSTRIAL APPLICABILITY

The screen printer and the screen printing method of the invention yield an advantage of the ability to miniaturize a configuration of the printer and facilitate cartridge replacement work and are also applied to a field in which a substrate is printed with electronic component bonding paste.

DESCRIPTIONS OF THE REFERENCE NUMERALS AND SYMBOLS

1 SCREEN PRINTER
2 SUBSTRATE POSITIONING SECTION
5 SUBSTRATE
7 MASK PLATE
7a PATTERN HOLE
9 CREAM SOLDER
10 SQUEEGEE HEAD
11 HEAD ELEVATION MECHANISM
12 HEAD MOVING MECHANISM
13 HEAD DRIVE MECHANISM
14 JOINT
15 CYLINDER
16 SQUEEGEE UNIT
16A UPPER PORTION
16B LOWER PORTION
17 HINGE
18A, 18B SCRAPING MEMBER
31 CARTRIDGE
32 PRESSURIZING PLATE
35 PRINT SPACE
36 FITTING SECTION
37a FITTING SLOT
38a POSITIONING PIN
40 HOLDING MECHANISM
41a POSITIONING HOLE
42a FITTING GROOVE
43 SHAFT HOLDING MEMBER
44 SHAFT SUPPORT
44a PIVOT
45 SHAFT MEMBER

The invention claimed is:

1. A screen printer that prints a substrate with paste by a pattern hole of a mask plate, the screen printer comprising:
   a squeegee head configured to slide over the mask plate via a head drive mechanism,
   the squeegee head comprises a joint joined to the head drive mechanism;
   a replaceable paste reservoir that stores paste;
   a paste pressurizing unit that is placed on the joint and that pressurizes the paste in the paste reservoir;
   a print space that stores the pressurized paste and that brings the paste into contact with a surface of the mask plate; and
   two scraping members that form front and back walls of the print space in a squeegeeing direction and whose lower ends contact a surface of the mask plate;
   the paste reservoir, the print space, and the scraping members configure a squeegee unit that can be integrally attached to and detached from the joint; and
   a holding mechanism that positions and holds the squeegee unit with respect to the joint having a shaft support which is joined to the joint and which has a vertically-oriented pivot, a shaft member that horizontally extends from the shaft support and that is turnable around the pivot, and a fitting section that is formed in the squeegee unit and to which the shaft member is removably fitted.

2. The screen printer according to claim 1, wherein the holding mechanism has a turn inhibition mechanism that inhibits relative turning between the fitting section and the shaft member while the shaft member is fitted into the fitting section.

3. The screen printer according to claim 1, wherein the holding mechanism has a positional misalignment prevention mechanism that regulates occurrence of axial, radial, relative displacement between the fitting section and the shaft member while the shaft member is fitted to the fitting section.

4. The screen printer according to claim 1, wherein an upper portion including the paste reservoir is separable from a lower portion including the print space within the squeegee unit; the upper portion and the lower portion are hinged together; and the upper portion can be opened and closed while axially supported by the lower portion.

5. A screen printing method for printing a substrate with paste through a pattern hole of a mask plate, the method comprising the steps of:
   providing a squeegee head configured to slide over the mask plate via a head drive mechanism,
   the squeegee head comprises:
   a joint joined to the head drive mechanism;
   a replaceable paste reservoir that stores paste;
   a paste pressurizing unit that is placed on the joint and that pressurizes the paste in the paste reservoir;
   a print space that stores the pressurized paste and that brings the paste into contact with a surface of the mask plate;
   two scraping members that form front and back walls of the print space in a squeegeeing direction and whose lower ends contact a surface of the mask plate;
   the paste reservoir, the print space, and the scraping members configure a squeegee unit that can be integrally attached to and detached from the joint; and
   a holding mechanism that positions and holds the squeegee unit with respect to the joint having a shaft support which is joined to the joint and which has a vertically-oriented pivot, a shaft member that horizontally extends from the shaft support and that is turnable around the pivot, and a fitting section that is formed in the squeegee unit and to which the shaft member is removably fitted;
   pressurizing the paste in the paste reservoir to house the paste in the print space below and bring the paste into contact with the surface of the mask plate; and
   sliding the squeegee head over the mask plate by the head drive mechanism to thereby print the paste,
   wherein when the paste in the paste reservoir has run out the squeegee unit is rotated with respect to the joint by turning the shaft member around the shaft support, and the fitting section is detached from the shaft member, thereby separating the squeegee unit from the joint and replacing the paste reservoir.

* * * * *